United States Patent [19]

Kressel et al.

[11] 3,883,888

[45] May 13, 1975

[54] EFFICIENCY LIGHT EMITTING DIODE

[75] Inventors: Henry Kressel, Elizabeth, N.J.; Harry Francis Lockwood, New York, N.Y.

[73] Assignee: RCA Corporation, New York, N.Y.

[22] Filed: Nov. 12, 1973

[21] Appl. No.: 414,757

[52] U.S. Cl. ........................ 357/16; 357/17; 357/55

[51] Int. Cl. .......................... H01l 11/00; H01l 15/00

[58] Field of Search .................. 317/235, 27, 42, 47

[56] References Cited

UNITED STATES PATENTS

| | | | |
|---|---|---|---|
| 3,262,059 | 7/1966 | Gunn et al. | 317/235 AC |
| 3,428,845 | 2/1969 | Nelson | 317/235 N |
| 3,530,324 | 9/1970 | Koller et al. | 317/235 N |
| 3,560,275 | 2/1971 | Kressel et al. | 317/235 N |
| 3,728,785 | 4/1973 | Schmidt | 317/235 N |
| 3,758,875 | 9/1973 | Hayashi | 317/235 AC |

*Primary Examiner*—Andrew J. James
*Attorney, Agent, or Firm*—G. H. Bruestle; D. S. Cohen

[57] ABSTRACT

A single crystalline body of three conductivity regions. The center conductivity region forms junctions with the other two regions that diverge from each other as the junctions extend toward the emitting surface of the light emitting diode. The divergent junction structure improves the waveguiding of the generated light toward the emitting edge.

5 Claims, 1 Drawing Figure

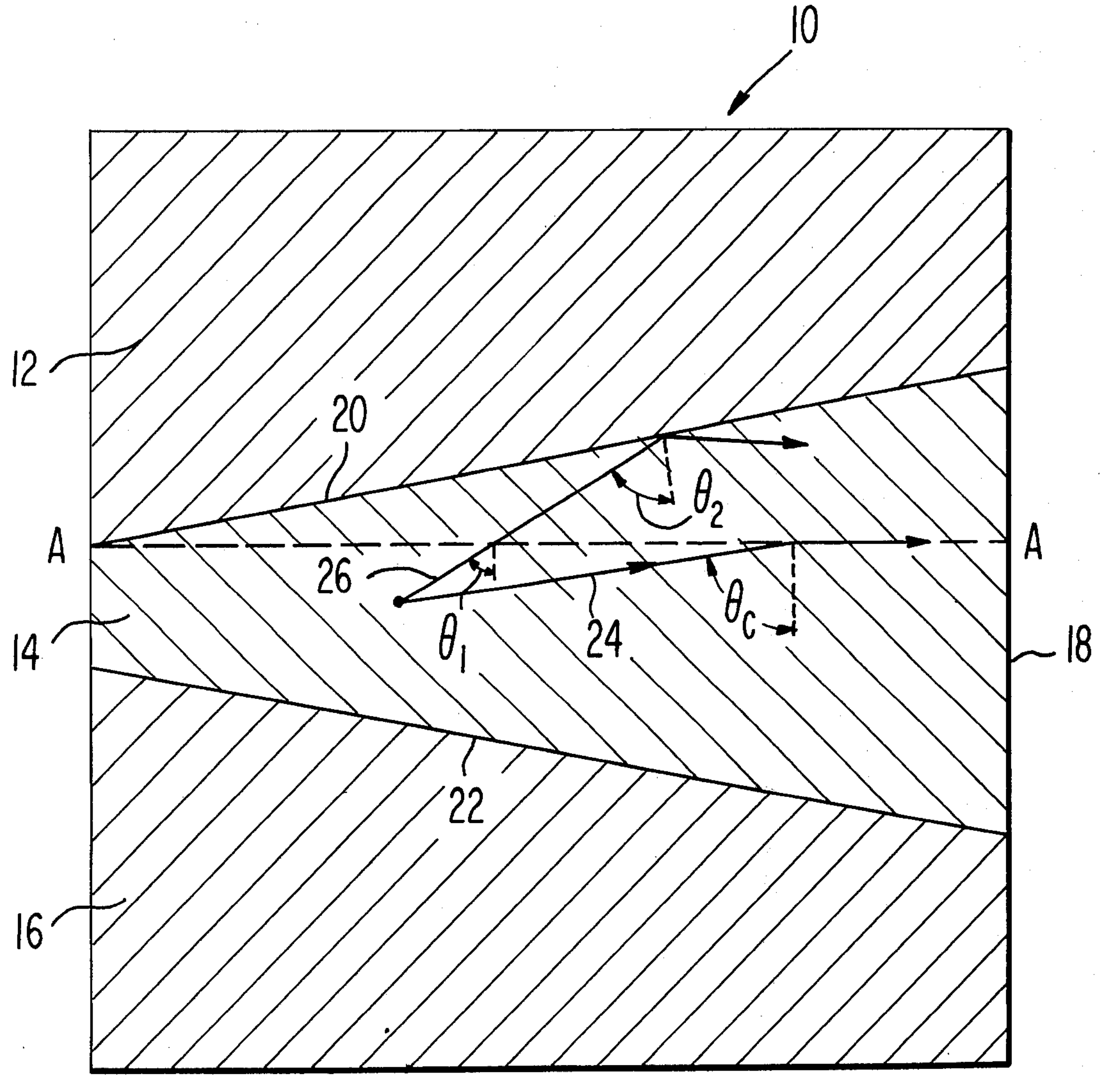
10
12
20
A
26
θ2
A
14
θ1
24
θc
18
22
16

EFFICIENCY LIGHT EMITTING DIODE

BACKGROUND OF THE INVENTION

The present invention relates to a semiconductor light emitting diode, and, more particularly to a semiconductor light emitting diode with improved waveguiding.

Semiconductor light emitting diodes, in general, are bodies of a single crystalline semiconductor material which when biased, emit incoherent light, through the recombination of pairs of oppositely charged carriers. The conventional heterojunction light emitting diode has two plane parallel conductivity regions and between them is a third region, which is the recombination region. Between the third region and the plane parallel regions, parallel junctions are formed. The recombination region is of a lower bandgap energy than the two plane parallel regions, which causes the recombination region to have a higher index of refraction than the two plane parallel regions. Only some of the light radiation generated in the recombination region is guided toward the emitting surface by being reflected off the parallel junctions.

In semiconductor light emitting diodes it is desirable for improvided efficiency to have as much of the light generated in the recombination region guided to the desired emitting surface.

SUMMARY OF THE INVENTION

A semiconductor light emitting diode comprising a body of single crystalline material having a pair of spaced heterojunctions extending to an edge and being divergent to said edge.

BRIEF DESCRIPTION OF THE DRAWING

The FIGURE of the drawing is a cross-sectional view of a form of the improved efficiency semiconductor light emitting diode of the present invention, showing how the waveguiding is made more efficient.

DETAILED DESCRIPTION

Referring to the drawing, a form of the semiconductor light emitting diode of the present invention is generally designated as 10. The semiconductor light emitting diode 10 comprises a body of a semiconductor material having a P type conductivity region 12, and an N type conductivity region 16. Between the P and N type regions 12 and 16 is a region 14 which can either be an N or P type conductivity region or be divided into both N and P type regions. Regions 12 and 16 are of a material with a molecular structure such that they possess a higher energy bandgap than region 14, and consequently a lower index of refraction than region 14. Typically, all three conductivity regions 12, 14 and 16 can be of the material AlGaAs, with regions 12 and 16 having a higher concentration of Al than region 14, and thus, are of a higher energy bandgap. Alternatively, region 14 can be of any material having a lower energy bandgap than the material of regions 12 and 16.

Between regions 12 and 14 is a junction designated as 20 and between regions 14 and 16 is a junction designated as 22. Junctions 20 and 22 diverge as they extend to the emitting surface 18, thus, forming nonparallel heterojunctions.

In the drawing, line A—A represents the parallel junction of a conventional semiconductor light emitting diode. A light ray 24 falling on a parallel junction, as represented by line A—A, at the critical angle, $\theta c$, will be internally reflected. As is well known in the art, any light ray falling on such parallel junction at an angle less than the critical angle, $\theta c$, will only partially be reflected, while any light ray falling on the plane parallel junction at an angle greater than the critical angle, $\theta c$, will be totally reflected.

If a light ray 26 falls on the parallel junction represented by line A—A at an angle $\theta_1$, which is smaller than critical angle $\theta c$, the light ray would not be reflected, but the same light ray will fall on divergent junction 20 at an angle designated $\theta_2$. Angle $\theta_2$ may be equal to or larger than the critical angle $\theta c$ and thereby be reflected off of divergent junction 20. While light ray 26 would be incompletely reflected off of the parallel junction A—A, it may be totally reflected off of divergent junction 20. A light ray falling on divergent junction 22 will behave in the same manner. Thus, in the present invention, more light rays are reflected off of the divergent junction surfaces and out to the emitting surface than are reflected off the conventional parallel junction light emitting diode. A light emitting diode with divergent junctions is thereby more efficient in its manner of wave-guiding incoherent light radiation.

The drawing illustrates only one form of the present invention. Another form of the present invention can have one of the heterojunctions divergent and the other parallel. Still another form of the semiconductor light emitting diode can have a "large optical cavity" structure, as referred to in "An Efficient Large Optical Cavity Injection Laser," by H. F. Lockwood et al, APPLIED PHYSICS LETTERS, Vol. 17, No. 12, Dec. 1, 1970, where the region 14 is divided into N and P type regions.

Fabrication of the present invention can be by the liquid phase epitaxy procedure described in U.S. Pat. No. 3,747,016, issued July 17, 1973 to H. Kressel et al. In fabrication of the improved efficiency light emitting diode after a layer is grown it is polished to the angle desired for the divergent heterojunction, and another layer is then grown on it. After this second layer is grown, it can either be polished to the desired angle to form another divergent heterojunction, or not polished so as to form a parallel heterojunction when the next layer is grown on it.

We claim:

1. A semiconductor light emitting diode comprising a body of single crystalline material having a pair of spaced heterojunctions extending to an edge and said heterojunctions being divergent with respect to each other to said edge.

2. A semiconductor light emitting diode in accordance with claim 1 in which said body includes a first region of one conductivity type, a second region of an opposite conductivity type and a third region of either conductivity type between said first and second regions, the junctions between said third region and each of said first and second regions being said heterojunctions.

3. A semiconductor light emitting diode in accordance with claim 2 in which said third region has an index of refraction higher than the index of refraction of said first and second regions.

4. A semiconductor light emitting diode in accordance with claim 3 in which said first and second regions are of a material of a higher bandgap energy than the material of said third region to provide the difference in the indices of refraction.

5. A semiconductor light emitting diode in accordance with claim 2 in which said third region is divided into both an N and P type subregion.

* * * * *